US010192887B2

(12) United States Patent
Wang et al.

(10) Patent No.: US 10,192,887 B2
(45) Date of Patent: Jan. 29, 2019

(54) METHOD TO IMPROVE CRYSTALLINE REGROWTH

(71) Applicant: GLOBALFOUNDRIES INC., Grand Cayman (KY)

(72) Inventors: Yun Y. Wang, Poughquaq, NY (US); Oh-Jung Kwon, Hopewell Junction, NY (US); Stephen G. Fugardi, New Milford, CT (US); Sean M. Dillon, Fishkill, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/817,362

(22) Filed: Nov. 20, 2017

(65) Prior Publication Data

US 2018/0090516 A1 Mar. 29, 2018

Related U.S. Application Data

(62) Division of application No. 15/084,807, filed on Mar. 30, 2016, now Pat. No. 9,853,055.

(51) Int. Cl.
*H01L 27/108* (2006.01)
*H01L 27/12* (2006.01)
*H01L 49/02* (2006.01)
*H01L 21/285* (2006.01)

(52) U.S. Cl.
CPC .... *H01L 27/1207* (2013.01); *H01L 21/28512* (2013.01); *H01L 27/10829* (2013.01); *H01L 27/10861* (2013.01); *H01L 28/60* (2013.01); *H01L 28/75* (2013.01)

(58) Field of Classification Search
CPC ................... H01L 27/10829; H01L 27/10861
See application file for complete search history.

(56) References Cited

U.S. PATENT DOCUMENTS

| | | | |
|---|---|---|---|
| 5,185,294 A | 2/1993 | Lam et al. | |
| 6,194,736 B1 | 2/2001 | Chaloux et al. | |
| 6,326,658 B1 * | 12/2001 | Tsunashima | H01L 27/10867 257/301 |
| 6,974,991 B2 | 12/2005 | Cheng et al. | |
| 8,343,838 B2 | 1/2013 | Koester | |
| 2005/0017282 A1 | 1/2005 | Dubuzinsky et al. | |
| 2005/0277264 A1 | 12/2005 | Cheng et al. | |

OTHER PUBLICATIONS

Riley, D., et al., "The Impact of Carbon on the Warpage of e-SiGe Wafers During Laser Anneal", 214th ECS Meeting, Abstract #2418, Oct. 14, 2008, 1 page, The Electrochemical Society.

* cited by examiner

*Primary Examiner* — Asok K Sarkar
*Assistant Examiner* — Grant Withers
(74) *Attorney, Agent, or Firm* — Scully Scott Murphy and Presser; Frank Digiglio

(57) ABSTRACT

The migration of dislocations into pristine single crystal material during crystal growth of an adjacent conductive strap is inhibited by a conductive barrier formed at the interface between the layers. The conductive barrier may be formed by implanting carbon impurities or depositing Si:C layer that inhibits dislocation movement across the barrier layer, or by forming a passivation layer by annealing in vacuum prior to deposition of amorphous Si to prevent polycrystalline nucleation at the surface of single crystalline Si, or by implanting nucleation promoting species to enhance the nucleation of polycrystalline Si away from single crystalline Si.

10 Claims, 9 Drawing Sheets

METHOD TO IMPROVE CRYSTALLINE REGROWTH

BACKGROUND

The present application relates generally to the manufacture of semiconductor devices, and more specifically to the inhibition or prevention of defect-related failures in such devices.

The presence of defects in crystalline materials used in semiconductor devices is understood to be a cause of device underperformance or failure. Specifically, two-dimensional crystalline defects (i.e., dislocations and stacking faults) are formed in semiconductor materials, inter alia, from process-induced mechanisms such as ion implantation and crystal re-growth, which are used to form the source, drain, well and contact regions in complementary metal-oxide-semiconductor (CMOS) devices.

The formation and propagation of dislocations within a device architecture can adversely affect the electrical characteristics of the device. For example, dislocations can change the concentration of point defects adjacent to the dislocation loop. In n-type materials, dislocations behave as acceptors, while in p-type material dislocations behave as donors. Such behavior leads to formation of a leakage path that follows the propagation of the defect. If a dislocation propagates into the p-n junction of a device, it can increase the leakage current when it spans the device junction or even cause total failure of the device.

In view of the foregoing, it would be advantageous to provide a processing method for minimizing or preventing dislocation related failures.

SUMMARY

In accordance with embodiments of the present application, a semiconductor device includes a conductive strap that electrically connects an electrode within a single crystal region of a semiconductor substrate. A conductive barrier layer is provided between the conductive strap and the single crystal region, where the conductive barrier layer includes carbon, hydrogen, cobalt or titanium nitride.

A particular semiconductor device is a deep trench capacitor formed in a semiconductor substrate. The capacitor includes a buried plate disposed about an exterior portion of a trench located within the substrate, a node dielectric disposed over the buried plate, an electrode disposed over the node dielectric, and a conductive strap electrically connecting the electrode to a single crystal region of the substrate. A conductive barrier layer is disposed between the conductive strap and the single crystal region, where the barrier layer includes carbon, hydrogen, cobalt or titanium nitride.

A method of making a semiconductor device includes forming an electrode in a semiconductor substrate that includes a single crystal region, forming a conductive barrier layer over at least one of the electrode and the single crystal region, and forming a conductive strap over the conductive barrier layer to electrically connect the electrode with the single crystal region.

BRIEF DESCRIPTION OF THE DRAWINGS

The following detailed description of specific embodiments of the present application can be best understood when read in conjunction with the following drawings, where like structure is indicated with like reference numerals and in which.

DETAILED DESCRIPTION

Figure 1:
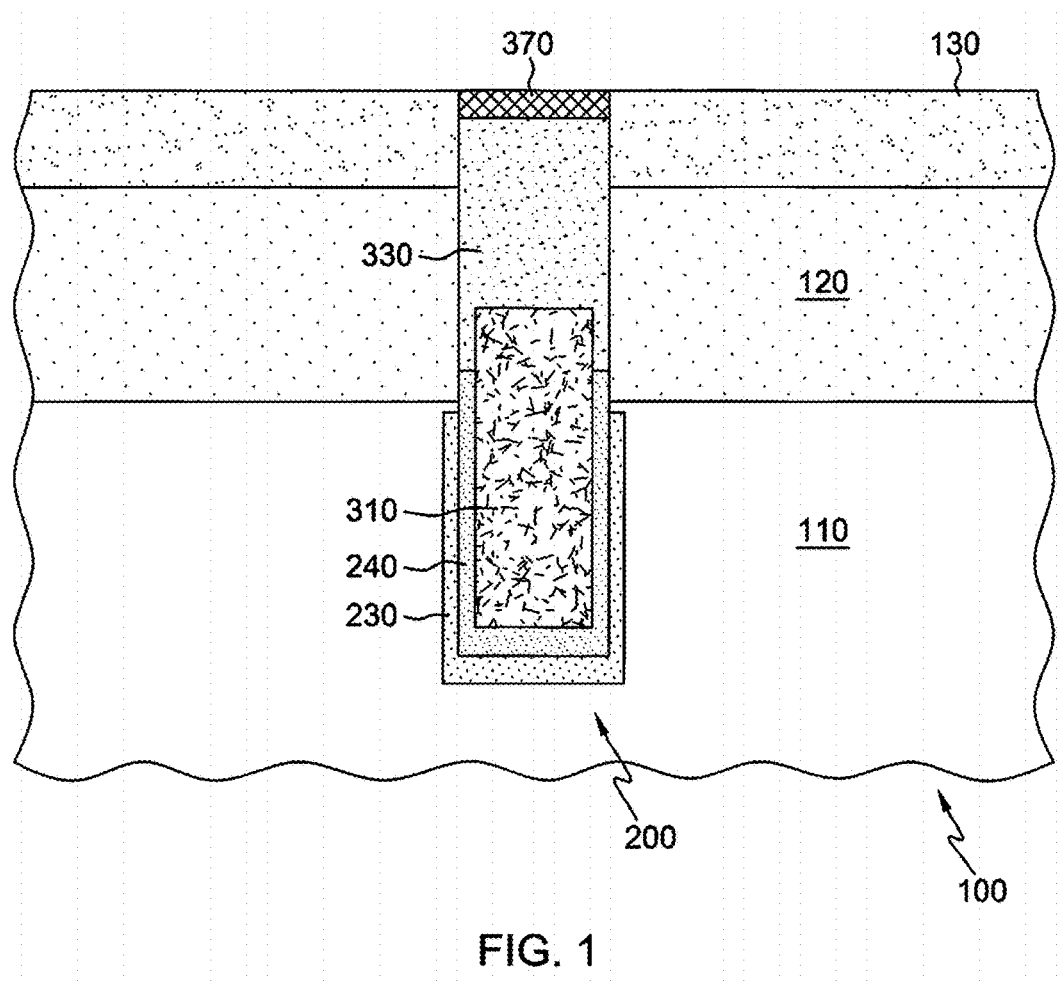
FIG. 1 is a schematic illustration showing the formation of a conductive strap.
Figure 2A:
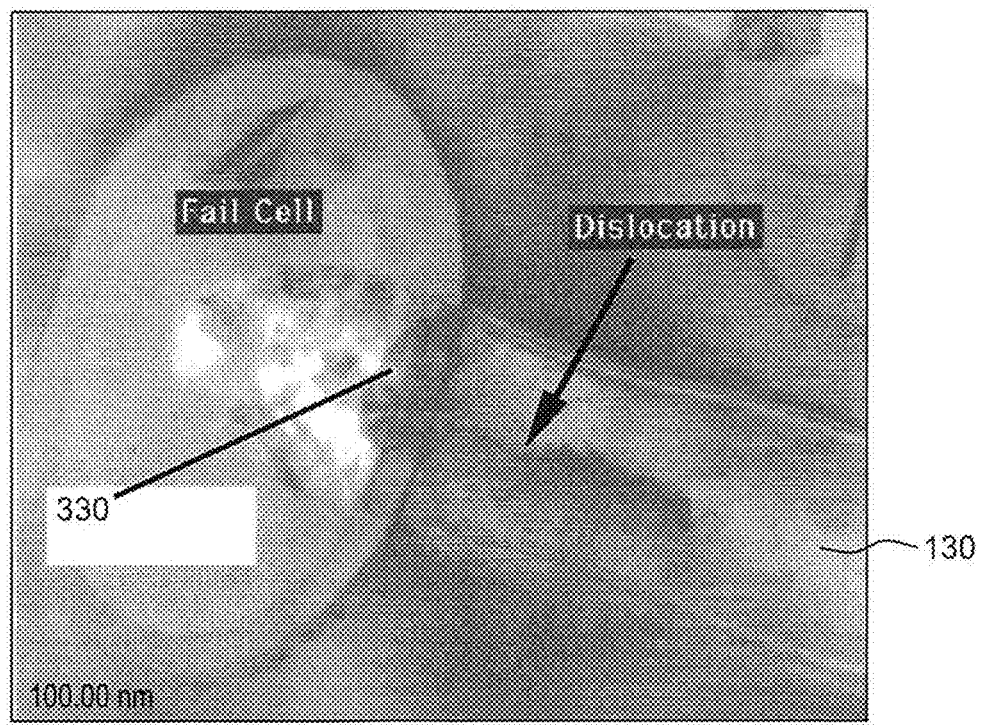
FIGS. 2A and 2B are plan view and cross-sectional view transmission electron microscope (TEM) images of a dynamic random access memory (DRAM) cell showing a crystalline defect within the cell architecture.
Figure 2B:
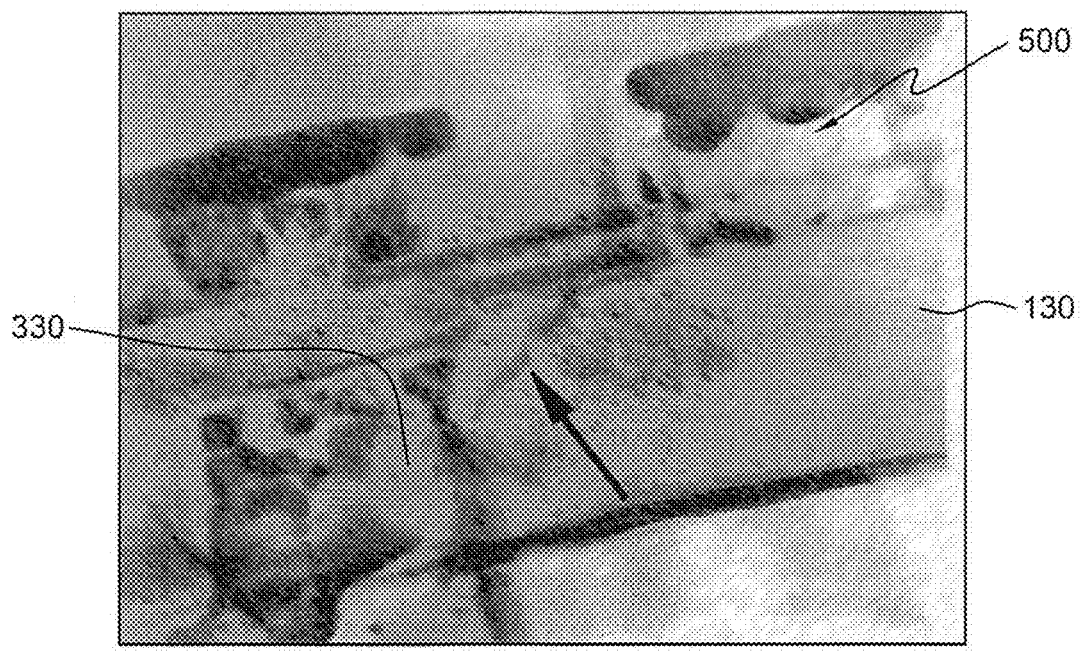
Figure 3A:
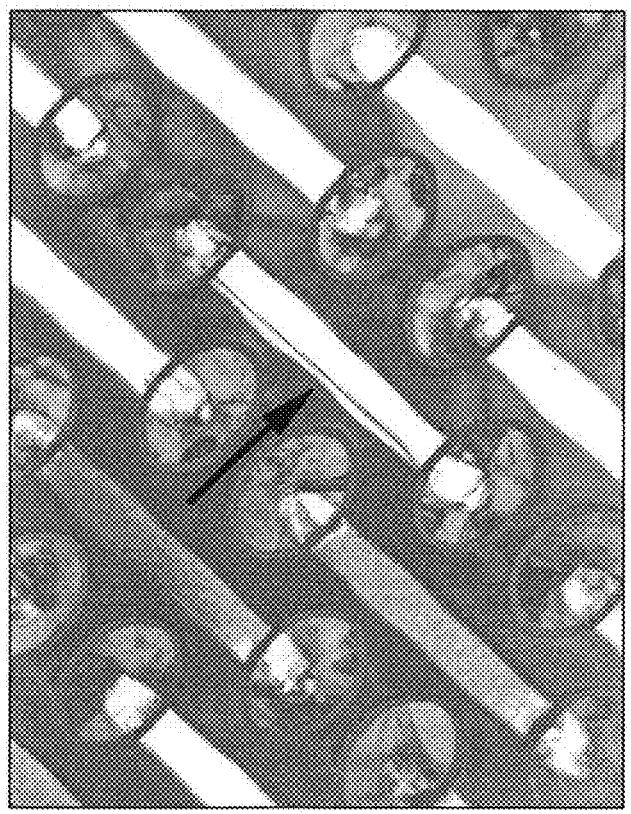
FIGS. 3A and 3B are plan view and cross-sectional view transmission electron microscope (TEM) images of a dynamic random access memory (DRAM) cell showing a crystalline defect within the cell architecture.
Figure 3B:
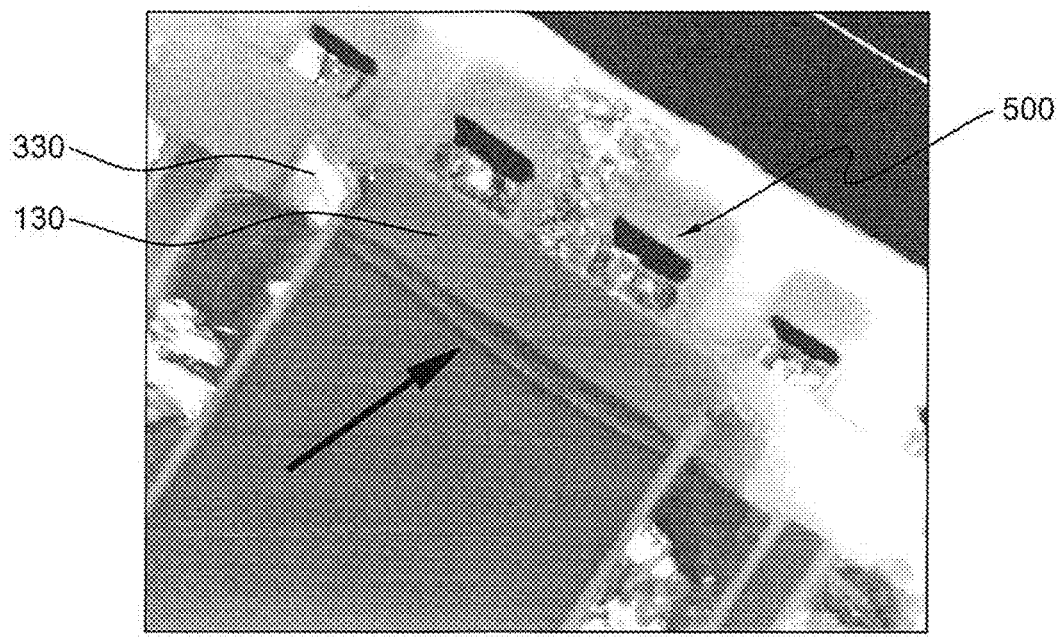

Reference will now be made in greater detail to various embodiments of the subject matter of the present application, some embodiments of which are illustrated in the accompanying drawings. The same reference numerals will be used throughout the drawings to refer to the same or similar parts.

The formation and propagation of defects such as dislocations may lead to a loss of function in integrated circuits and especially in charge storage elements such as trench capacitors. Disclosed are methods for pinning dislocations in poly-crystalline Si and thus minimizing their deleterious effects on device performance. Also disclosed are methods for controlling crystalline re-growth during device manufacture. In the instant application, embodiments of the disclosed method are described in conjunction with the conductive buried strap of an embedded dynamic random access memory (EDRAM). However, it will be appreciated that the method may be applied to other device architectures, for example, deposited epitaxial regions in a multi-gate device such as a FinFET.

Semiconductor memory devices such as dynamic random access memory devices include capacitors that are accessed by transistors to store and retrieve data. An example capacitor is a deep trench capacitor. Deep trench capacitors are typically buried within a semiconductor substrate. For such geometries, a buried strap contact (also referred to herein as a conductive strap) is formed to connect the deep trench capacitor to a transfer device such as an access transistor.

For instance, in trench dynamic random access memory, deep trenches are formed by reactive ion etch (RIE) and dielectric nodes are formed on the sidewalls of the trench, followed by an amorphous Si fill. During subsequent processing, the amorphous silicon is crystallized to from a conductive pass to the Si device. At the interface between the amorphous Si fill and the single crystal silicon within the device region, the amorphous Si tends to nucleate on the surface of the single crystal material, which creates the same crystalline orientation within the resulting polycrystalline silicon as in the single crystalline Si. When re-crystallized amorphous Si has the same crystalline orientation as crystalline Si, crystalline defects such as stacking faults (planar defects) or dislocation (line defects) within the re-crystallized material can propagate into the single crystal material causing device failure.

By way of example, and with reference to FIG. 1, a deep trench capacitor can be formed in a semiconductor-on-insulator (SOI) substrate 100. Alternatively, substrate 100 may comprise a bulk semiconductor substrate. The SOI substrate 100 can be fabricated, for example, using a separation by implantation of oxygen (SiMOX) process or a wafer bonding technique. Typically the substrate 100 thickness may be about, but is not limited to, several hundred microns. For example, substrate 100 may have a thickness ranging from 0.5 mm to 1.5 mm. The substrate 100 includes a buried oxide layer 120 disposed between a semiconductor handler wafer 110 and a semiconductor layer 130. In embodiments, the semiconductor layer 130 (and the semiconductor handler wafer 110) can be any semiconductor material such as Si, SiGe, Ge, GaAs, as well as other III/V or II/VI compound semiconductors. The semiconductor layer 130 may be a single crystal (monocrystalline) layer having, for example, a dislocation density of $<10^6/cm^2$. In some embodiments, the semiconductor handler substrate 110 and the semiconductor layer 130 comprise the same semiconductor material. In one example, silicon is used for both the semiconductor handler substrate 110 and the semiconductor layer 130. In other embodiments, the semiconductor handler substrate 110 comprises a different semiconductor material than the semiconductor layer 130. In one example, the semiconductor handler substrate 110 can be composed of silicon, while the semiconductor layer 130 may be composed of SiGe or a III/V compound semiconductor.

It is noted that FIG. 1 is not necessarily to scale. The depth of trench capacitor 200 can be 3 microns or greater, e.g., 5 to 6 microns, while the thickness of the buried oxide layer 120 and the semiconductor layer 130 may be significantly less.

An exemplary deep trench capacitor includes a buried plate, a node dielectric, and an inner electrode. The buried plate and the inner electrode serve as two electrical conductors and the node dielectric serves as the insulator between the two conductors.

A trench capacitor can be formed by etching a trench 200 into the substrate 100. In embodiments, the deep trench capacitor can be an EDRAM. By way of example, and still with reference to FIG. 1, a deep trench 200 is formed through layers 130, 120 and into handler substrate 110 using conventional lithography and etching processes. The lithography technique may include applying a photoresist (not shown) to an upper surface of the substrate, exposing the photoresist to a desired pattern of radiation and developing the exposed photoresist using a resist developer. The pattern in the photoresist may then be transferred to the substrate 100 using one or more etching techniques to form the deep trench. Suitable etching techniques include, but are not limited to, reactive ion etching (RIE), ion bean etching, plasma etching or laser ablation. The patterned photoresist may then be removed by resist stripping after etching has been completed.

After forming the trench 200, a doped region may be formed in the lower portion around and below the trench, which serves as the outer electrode or buried plate electrode 230 of the capacitor. A blanket doping technique may be used to form the buried plate electrode 230. Suitable doping techniques may include, but are not limited to, ion implantation, gas phase doping, plasma doping, plasma immersion ion implantation, cluster doping, infusion doping, liquid phase doping, solid phase doping, or any suitable combination of those techniques. In one embodiment, dopants may be implanted by one or more rounds of angled ion implantation to dope the sidewalls and the bottom of the deep trench 200. In doing so, dopants may be introduced into the substrate 110 to form the buried plate electrode 230. Dopants may include As, P, Sb, B, Ga, and In. In another embodiment substrate 110 can be formed using intrinsic doped epitaxial layer. Thickness of the epitaxial layer can be similar to the depth of trench capacitor and intrinsic dopant may be As, P, Sb, B, G and In.

The deep trench 200 may then be lined with the node dielectric 240, which may be formed directly over the buried plate electrode 230. The node dielectric layer serves as an insulating layer between the electrodes. The thickness of the node dielectric 240 may range from about 2 nm to about 6 nm. The node dielectric 240 may include a dielectric such as silicon dioxide, silicon nitride, silicon oxynitride, and the like. Alternately, the node dielectric 240 may include a high-k material having a dielectric constant greater than the dielectric constant of silicon nitride, which is about 7.5. Exemplary high-k materials include $HfO_2$, $Hf_xSi(1-x)O_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x may independently range from about 0.1 to about 3 and each value of y may independently range from 0 to about 2. In this case, the thickness of the node dielectric may range from about 2 nm to about 4 nm, although lesser and greater thickness may be used. The node dielectric may include a combination of multiple materials.

A metal layer (not shown), e.g., TiN, may be conformally deposited on the node dielectric 240 to a thickness of 1 to 7 nm, though other conductive materials and thicknesses may be used. The remaining portion of the trench 200 is then filled with polysilicon 310, which serves as an inner or upper electrode of the capacitor. Polysilicon layer 310 may be formed by initially depositing a layer of amorphous silicon into the trench 200, followed by a crystallization anneal at a suitable temperature, e.g., 600° C. Deep trenches may have extremely high aspect ratios, e.g., ranging from 10:1 to 100:1 or greater, which facilitates the arrangement of closely-packed arrays of capacitors.

Material layers including node dielectric 240 and polysilicon layer 310 may be formed using conventional deposition processes, e.g., chemical vapor deposition (CVD) or atomic layer deposition (ALD).

Once the trench 200 is filled with polysilicon 310 (i.e., "poly1"), the polysilicon layer 310, metal layer, and node dielectric material layer 240 are recess etched to remove the node dielectric from sidewalls of the semiconductor layer 130. The polysilicon 310, metal layer and node dielectric layer 240 may be recessed using a suitable wet or dry etching technique. In the illustrated embodiment, the etch rates of the metal layer and the node dielectric 240 are greater than the etch rate of the polysilicon such that the metal layer and the node dielectric 240 are recessed more than the polysilicon 310.

Thereafter, a layer of amorphous silicon is deposited on the wafer. The amorphous silicon layer is selectively etched back from the surface leaving a strap 330 that after crystallization provides a polycrystalline conductive bridge (i.e., "poly2") between the polysilicon 310 and the semiconductor layer 130. In FIG. 1, conductive strap 330 forms a bridge between polysilicon layer 310 and two adjacent semiconductor layers 130, though it will be appreciated that in alternate embodiments conductive strap 330 may form a bridge between polysilicon layer 310 and a single semiconductor layer 130. After removing any remnant amorphous silicon, the recessed trenches may be refilled with dielectric layer 370, which may be a portion of an interlayer dielectric covering the polysilicon 310 and the now buried strap 330.

The surrounding surfaces of the buried strap 330 have an important effect on its conductivity and solid state phase transformations that occur during subsequent oxidation and annealing steps. For instance, during these thermal steps, the polysilicon may recrystallize in the region of the buried strap 330 that is contiguous with the active semiconductor layer 130. This local epitaxy may induce the propagation of dislocations along slip lines into the active area and into the substrate, which affect capacitor performance.

Specifically, during crystallization of the amorphous silicon to form the poly2 strap 330, dislocations may propagate across the interface with and into the semiconductor layer 130, which leads to electrical defects that cause a loss of function in integrated circuits and especially in charge storage elements such as trench capacitors.

Example comparative devices illustrating the undesired migration of dislocations across the boundary between the polycrystalline conductive strap 330 and single crystal silicon are shown in FIGS. 2A, 2B, 3A, 3B, 4A and 4B. FIGS. 2A, 3A and 2B, 3B are transmission electron microscope (TEM) images showing top down plan views and cross-sectional views respectively of failed DRAMs, including a buried strap 330 formed over a sidewall of semiconductor (e.g., silicon) layer 130. A dislocation loop identified by the block arrow has penetrated into the semiconductor layer beneath access transistor 500.

Figure 4A:
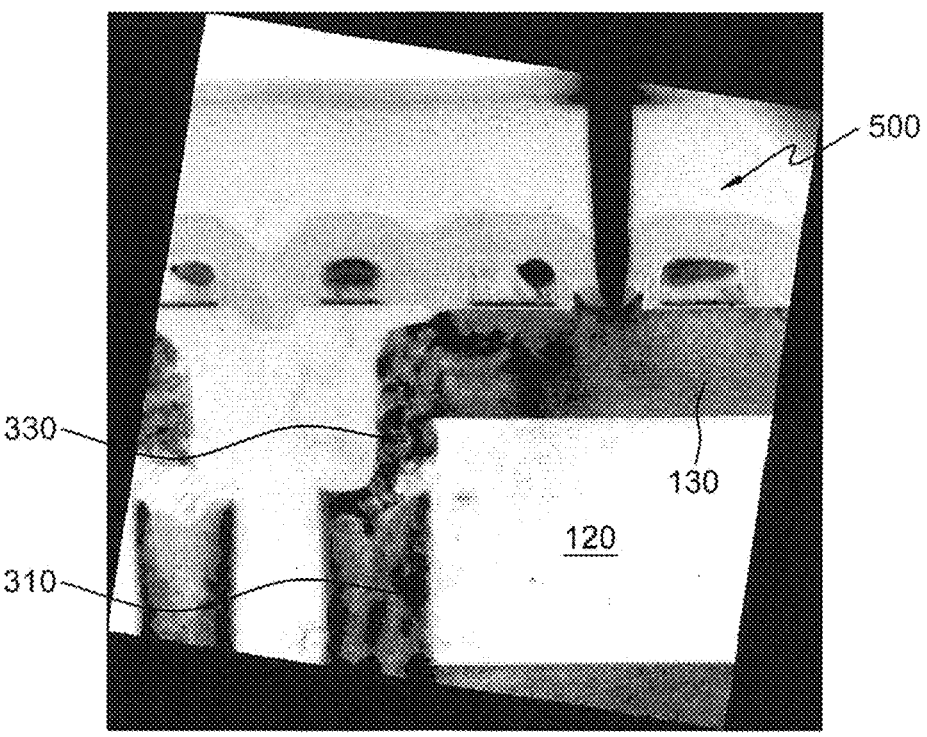
FIGS. 4A and 4B are bright field and dark field transmission electron microscope (TEM) images of a dynamic random access memory (DRAM) cell showing a crystalline defect under the gate of an access transistor.
Figure 4B:
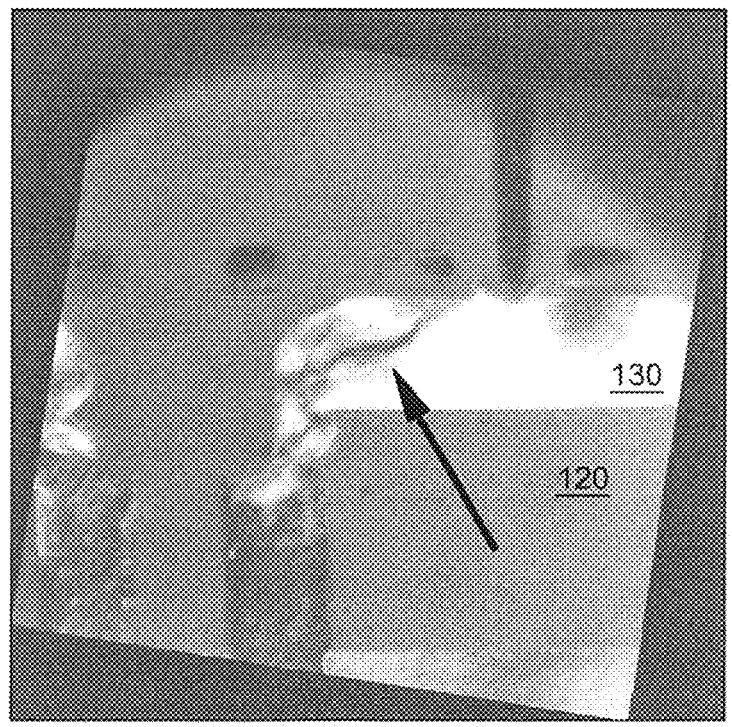

FIGS. 4A and 4B are bright field and dark field transmission electron microscope (TEM) images of a dynamic random access memory (DRAM) cell showing a crystalline defect under the gate of an access transistor 500.

With reference to FIG. 4A, regions having substantially the same crystalline orientation display comparable bright field contrast. Thus, absent additional processing to control the nucleation of polycrystalline material within the conductive strap 330, the conductive strap material nucleates and grows from the interface with the semiconductor layer 130, which creates a condition where dislocations can migrate across the boundary into the semiconductor layer 130.

Embodiments of the current application relate to the formation of a barrier that inhibits propagation of dislocations into the semiconductor layer 130, i.e., during crystallization of amorphous silicon to form conductive strap 330 (poly2). In embodiments, the barrier is formed at, or on, a surface of the semiconductor layer 130. In further embodiments, the barrier is a conductive barrier. In still further embodiments, polycrystalline layer 310 is treated in order to induce crystallization of the conductive strap material at the interface with the polycrystalline layer 310 rather than at the interface with the semiconductor layer 130.

Comparative methods directed at inhibiting dislocation propagation across crystalline boundaries involve nitridation of the incumbent material, i.e., annealing surfaces of the polycrystalline layer 310 and/or the semiconductor layer 130 within trench 200 in nitrogen gas or ammonia prior to deposition of amorphous silicon within the region of the conductive strap. The formation of a thin nitride layer at one or more interfaces, however, prohibitively increases the electrical resistance across the interface(s) especially for advanced device nodes.

Figure 5:
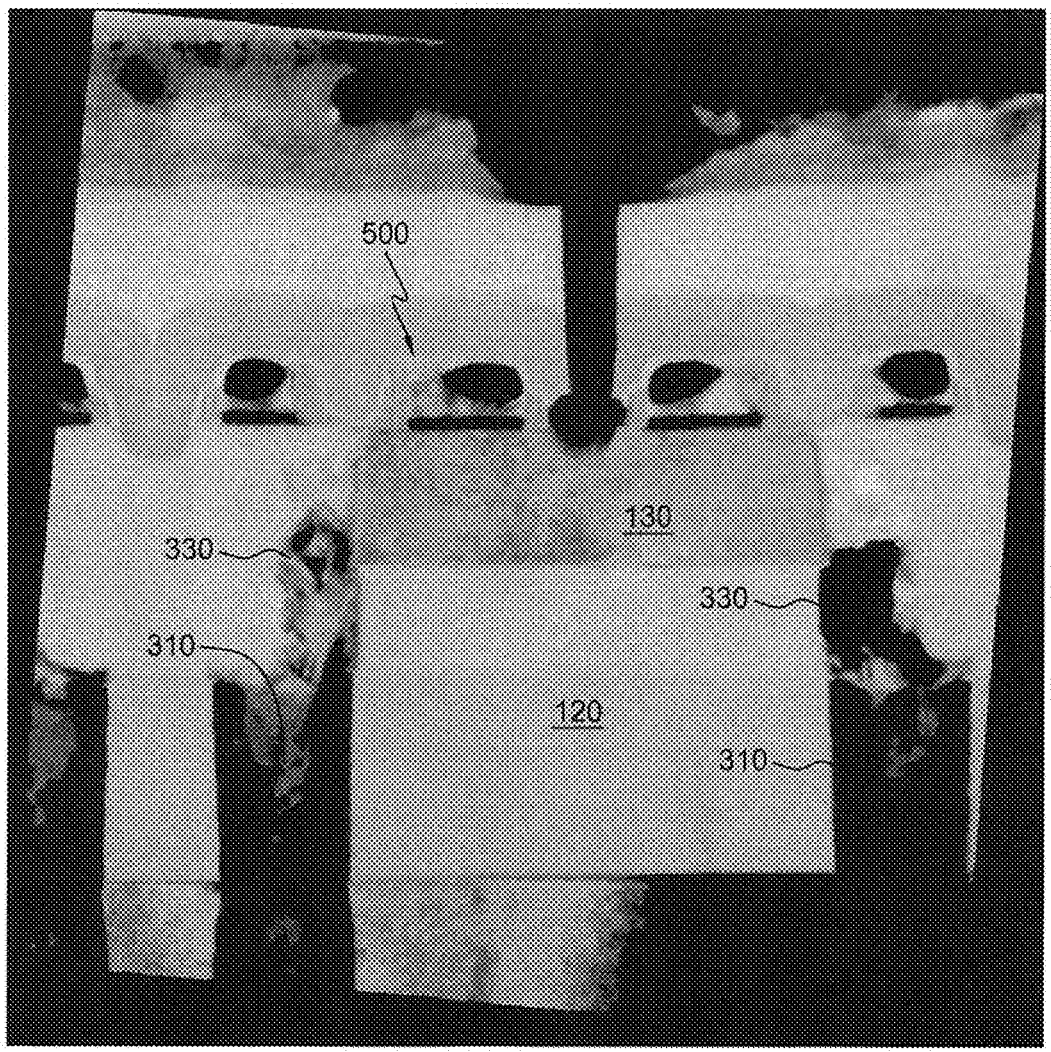
FIG. 5 is a cross-sectional TEM micrograph of a portion of a DRAM cell manufactured according to embodiments showing the absence of dislocation migration from the conductive strap into a crystalline silicon region of the device.

In embodiments, crystalline re-growth within semiconductor layer 130 is substantially or entirely prevented without incurring a resistance penalty. In one embodiment, prior to the deposition of amorphous silicon for the poly2 layer 330, the device architecture is annealed under vacuum (e.g., at a chamber pressure of less than $10^{-3}$ torr) at 400° C. to 600° C., e.g., 500° C. for 10 to 30 min. Without wishing to be bound by theory, the pre-deposition anneal is believed to hydrogenate (i.e., passivate) exposed surfaces of the polycrystalline layer 310 and/or the semiconductor layer 130. Such passivation is effective at blocking dislocation propagation but does not form a barrier to conduction. The absence of epitaxial re-growth of the buried strap material at the interface with the semiconductor layer 130 following such a pre-deposition anneal is shown in the cross-sectional TEM micrograph of FIG. 5. As shown in the figure, the crystalline orientation of the poly2 layer 330 is different than that of single crystal semiconductor layer 130, without an insulator layer disposed between the layers.

Figure 6:
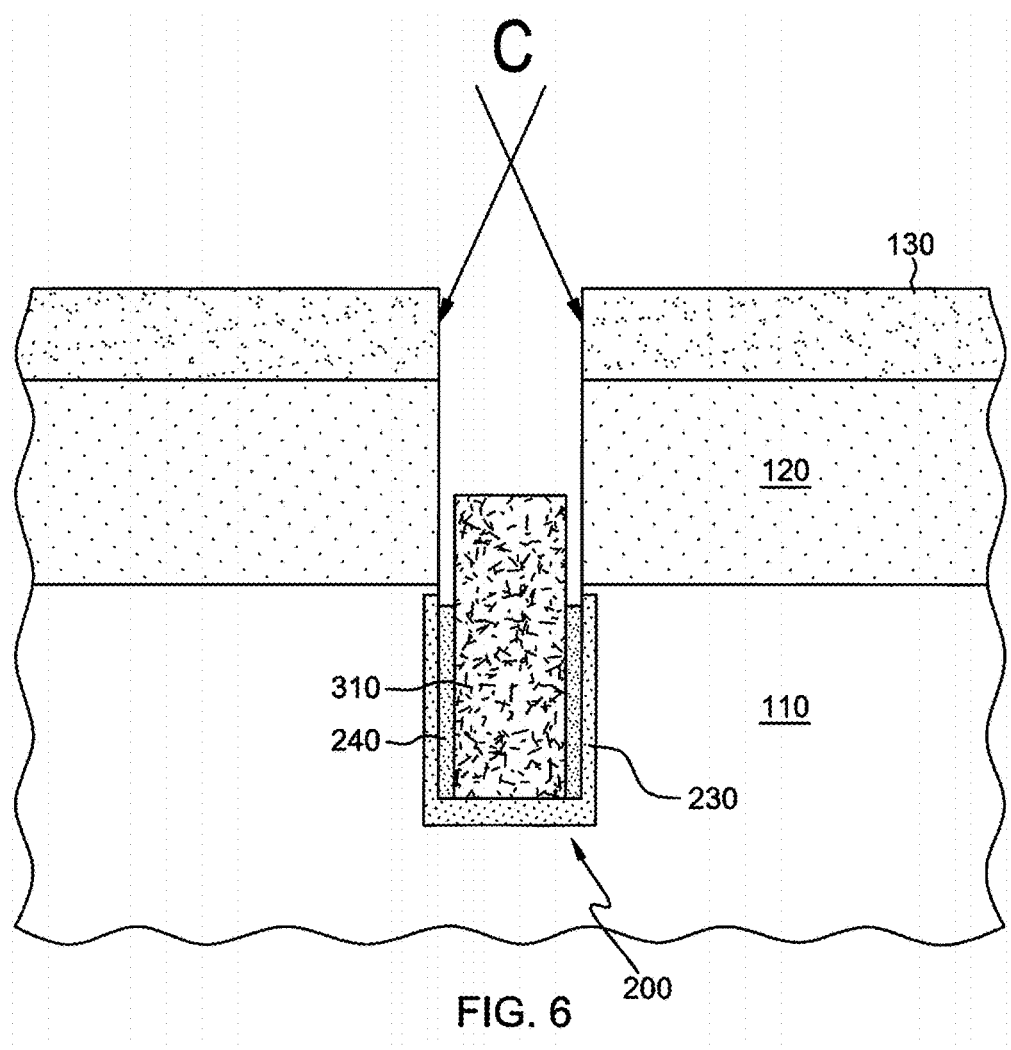
FIG. 6 is a schematic view of an embodiment for improving crystalline re-growth of a conductive strap using ion implantation of carbon into a crystalline silicon surface prior to formation of the conductive strap.

With reference to FIG. 6, and according to a further embodiment, during formation of the trench capacitor, a dislocation pinning species such as carbon is implanted into the semiconductor layer 130, i.e., into the semiconductor layer sidewall prior to deposition of the amorphous silicon. The compressive stress-inducing species, which is incorporated into the near surface region of the semiconductor layer 130 and which inhibits dislocation propagation into the semiconductor layer 130, may be implanted at a dose ranging from $1\times10^{14}/cm^2$ to $1\times10^{15}/cm^2$, e.g., $5\times10^{14}/cm^2$ at an implantation energy of 2 keV to 10 keV, e.g., 5 keV. The implant angle is generally 5 to 15 degrees, but may be less or greater. Carbon implantation has been shown to not significantly increase the strap resistance. According to the instant embodiment, the crystalline orientation of the poly2 layer may be the same as or different from the crystalline orientation of semiconductor layer 130, but the implanted dislocation pinning species inhibit dislocation motion in silicon, thus preventing dislocations from propagating into semiconductor layer 130.

Figure 7:
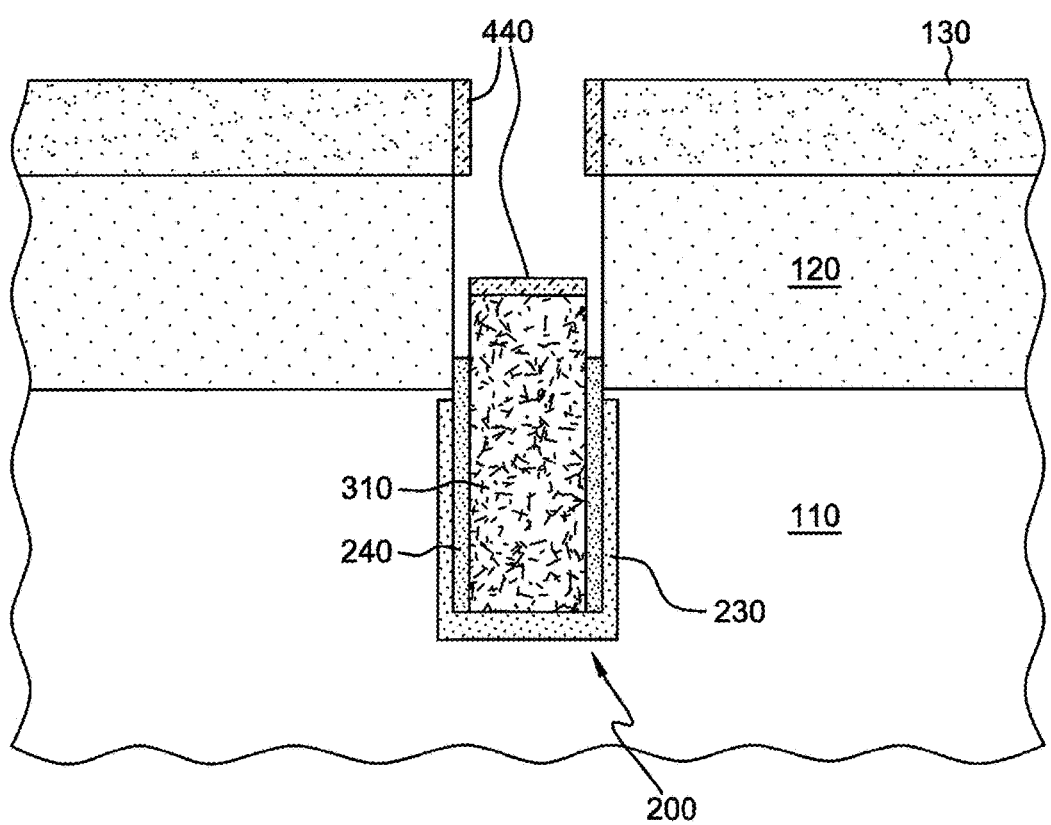
FIG. 7 is a schematic view of a further embodiment for improving crystalline re-growth of a conductive strap showing deposition of a carbon-containing layer over a crystalline silicon surface.

Turning to FIG. 7, according to a further embodiment, a thin layer 440 such as a carbon-containing layer (Si:C epitaxy layer) or a metallic layer (e.g., cobalt or titanium nitride) is formed over the semiconductor layer 130, i.e., over an exposed sidewall of the semiconductor layer 130 prior to filling the trench 200 with amorphous silicon. The thin layer 440 may also be formed over a top surface of polysilicon layer 310. The thickness of layer 440 may be 1 nm to 10 nm. An example carbon-containing layer is carbon-doped silicon (e.g., Si:C), which may include up to 10 atomic percent carbon.

The crystalline orientation of the poly2 layer may be the same as or different from the crystalline orientation of semiconductor layer 130, but intervening layer 440 prevents dislocations from propagating into semiconductor layer 130.

A carbon-containing layer may be an epitaxial layer deposited via chemical vapor deposition (CVD). For example, a CVD carbon-containing layer may be formed at a temperature of 400-500° C. from silane (SiH$_4$) and a suitable carbon-containing precursor. An example carbon-containing layer includes 5 atomic percent to 10 atomic percent carbon (balance silicon). Further carbon-containing layers may include, in addition to carbon and silicon, germanium and/or phosphorus. By way of example, a carbon-containing layer may include up to 5 atomic percent germanium (e.g., 0, 1, 2, 3, 4 or 5 atomic percent Ge, including ranges between any of the foregoing values) and/or up to 1 atomic percent phosphorus.

When a layer of amorphous silicon is deposited to form conductive strap 330, the amorphous silicon is formed over thin layer 440. During crystallization of the amorphous silicon, dislocations formed within the resulting polysilicon are inhibited from migrating into the semiconductor layer 130.

In the foregoing embodiments, the presence of an insulator layer (e.g., nitrides or oxides of silicon) at the interface between the polysilicon strap 330 and the semiconductor layer 130 is avoided. Without wishing to be bound by theory, nitrides and oxides of silicon, which may be formed by deposition of silicon nitride or silicon nitride, or via nitridation or oxidation of a surface of the semiconductor layer 130, negatively impact the electrical conductivity across the interface between the polysilicon strap 330 and the semiconductor layer 130.

In accordance with further embodiments of the present application, during crystallization of amorphous silicon to form the conductive polysilicon strap 330, the formation of crystal nuclei at the interface with the semiconductor layer 130 is minimized or avoided. Embodiments described herein encourage nucleation of the polysilicon remote from the semiconductor layer 130 and thus avoid epitaxial re-growth of the buried strap material at the interface with the semiconductor layer 130. In this case, the polycrystalline poly2 layer has a different crystalline orientation than single crystalline Si layer 130, without any insulator layer disposed between the polycrystalline Si and the single crystal semiconductor layer 130.

Figure 8:
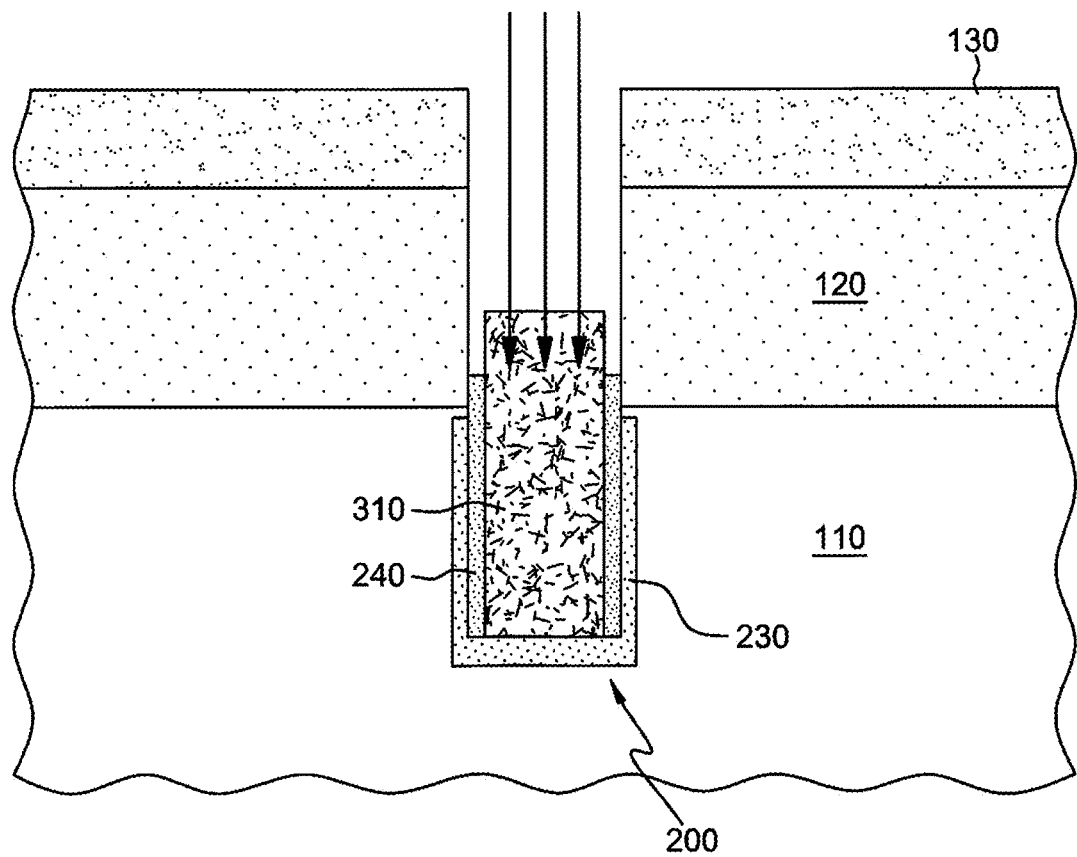
FIG. 8 is a schematic view of a further embodiment for improving crystalline re-growth depicting ion implantation into a polycrystalline layer prior to formation of a buried strap.

With reference to FIG. 8, ion implantation into polysilicon layer 310 may be used to promote crystallization of the over-formed amorphous silicon at the implanted interface relative to the interface with the semiconductor layer 130. Implanted titanium, iron, phosphorus or arsenic, for example, may lower the crystallization temperature of the amorphous silicon proximate to the implanted interface. Nucleation and growth of the strap polysilicon from the interface with polysilicon 310 will likely result in different crystallographic (non-epitaxial) orientations across the strap-semiconductor layer interface, which effectively hinders dislocation propagation across that interface (i.e., from poly2 into the semiconductor layer 130). The polycrystalline poly2 layer has a different crystalline orientation than single crystalline Si layer 130, without any insulator layer disposed between the polycrystalline Si and the single crystal semiconductor layer 130.

As an alternative to ion implantation, one or more nucleation-promoting species may be deposited onto an exposed surface of polysilicon 310 prior to deposition of the amorphous silicon. A nucleation-promoting species such as titanium may be directionally-deposited using a physical vapor deposition (PVD) method such as sputtering. In a similar vein, one or more nucleation-promoting species may be incorporated into polysilicon layer 310. For instance, a metallic impurity such as Fe, Ni, Cr, Ti or Mn, may be co-deposited with silicon to form polysilicon layer 310.

Figure 9:
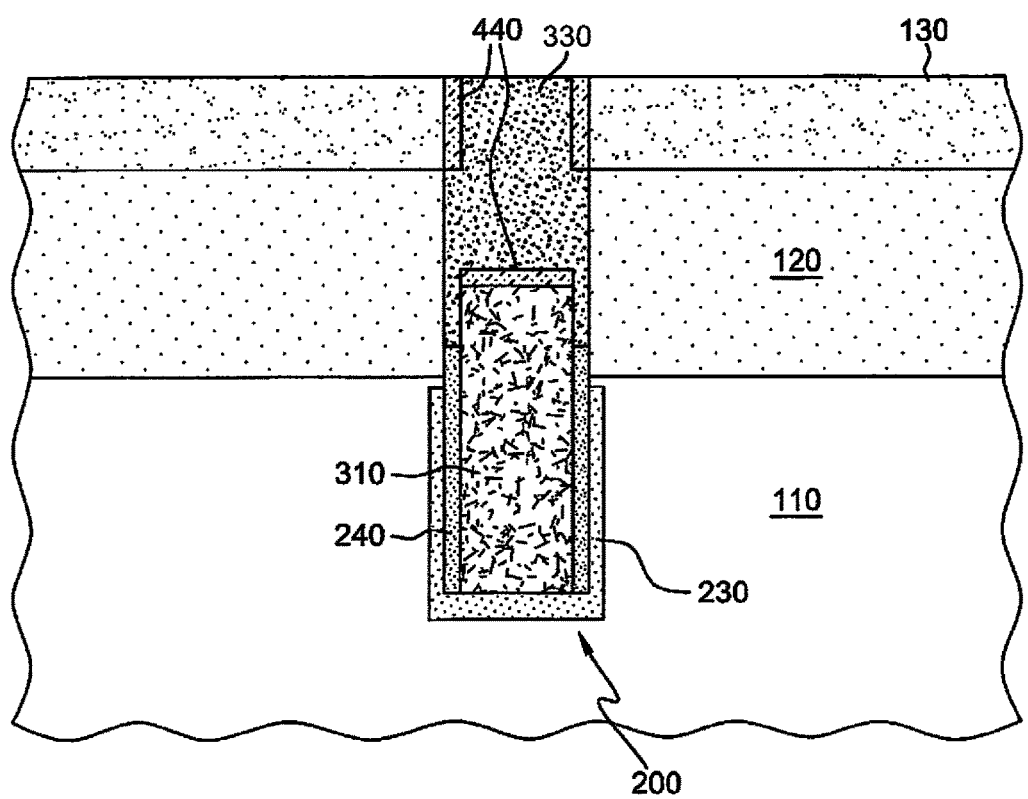
FIG. 9 is a schematic view showing a conductive barrier layer between a conductive strap and a crystalline silicon surface.

Referring to FIG. 9, shown is an example structure with intervening layer 440 disposed between conductive strap 330 and single crystal semiconductor layer 130.

Disclosed are methods of inhibiting or preventing dislocation migration. Embodiments of the method include forming a barrier that impedes dislocation motion across the barrier while not impeding the flow of electron or hole carriers. The barrier may be formed by implanting impurities that create a local stress field that inhibits dislocation movement across the barrier.

As used herein, the singular forms "a," "an" and "the" include plural referents unless the context clearly dictates otherwise. Thus, for example, reference to a "dopant" includes examples having two or more such "dopants" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a dopant that comprises carbon include embodiments where a dopant consists essentially of carbon and embodiments where a dopant consists of carbon.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed as new is:

1. A semiconductor device comprising:
   a conductive strap electrically connecting an electrode with a single crystal region of a semiconductor substrate; and
   a conductive barrier layer between the conductive strap and the single crystal region,
   wherein the conductive barrier layer comprises carbon, hydrogen, cobalt or titanium nitride, and at least one of germanium and phosphorus.

2. The semiconductor device of claim 1, wherein the conductive strap comprises polycrystalline silicon.

3. The semiconductor device of claim 1, wherein the electrode comprises polycrystalline silicon.

4. The semiconductor device of claim 1, wherein the conductive barrier layer thickness is from 0.1 to 10 nm.

5. The semiconductor device of claim 1, wherein the conductive barrier layer comprises carbon-doped silicon.

6. A deep trench capacitor in a semiconductor substrate, comprising:
- a buried plate disposed about an exterior portion of a trench located within the substrate;
- a node dielectric disposed over the buried plate;
- an electrode disposed over the node dielectric;
- a conductive strap electrically connected to the electrode and a single crystal region of the substrate; and
- a conductive barrier layer between the conductive strap and the single crystal region, wherein the conductive barrier layer comprises carbon, hydrogen, cobalt or titanium nitride, and at least one of germanium and phosphorus.

7. The deep trench capacitor of claim 6, wherein the conductive strap comprises polycrystalline silicon.

8. The deep trench capacitor of claim 6, wherein the electrode comprises polycrystalline silicon.

9. The deep trench capacitor of claim 6, wherein the conductive barrier layer thickness is from 0.1 to 10 nm.

10. The deep trench capacitor of claim 6, wherein the conductive barrier layer comprises carbon-doped silicon.

* * * * *